(12) United States Patent
Takao et al.

(10) Patent No.: US 9,950,898 B2
(45) Date of Patent: Apr. 24, 2018

(54) SEMICONDUCTOR DEVICE, INVERTER CIRCUIT, DRIVING DEVICE, VEHICLE, AND ELEVATOR

(71) Applicant: Kabushiki Kaisha Toshiba, Minato-ku (JP)

(72) Inventors: Kazuto Takao, Tsukuba (JP); Ryosuke Iijima, Setagaya (JP); Tatsuo Shimizu, Shinagawa (JP); Teruyuki Ohashi, Kawasaki (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 15/062,410

(22) Filed: Mar. 7, 2016

(65) Prior Publication Data

US 2016/0285445 A1 Sep. 29, 2016

(30) Foreign Application Priority Data

Mar. 24, 2015 (JP) .................................. 2015-061797
Dec. 7, 2015 (JP) .................................. 2015-238930

(51) Int. Cl.
*H03K 17/04* (2006.01)
*B66B 1/34* (2006.01)
(Continued)

(52) U.S. Cl.
CPC .............. *B66B 1/34* (2013.01); *H02M 7/003* (2013.01); *H02M 7/537* (2013.01); *H05K 7/1432* (2013.01); *H02M 1/32* (2013.01)

(58) Field of Classification Search
CPC .......... H01L 28/55; H01L 28/56; H01L 28/57; H01L 28/60; H01L 28/65; H01L 28/75;
(Continued)

(56) References Cited

U.S. PATENT DOCUMENTS 5,623,399 A * 4/1997 Ishii ...................... H02M 7/003
363/132
6,028,779 A 2/2000 Sakamoto et al.
(Continued)

FOREIGN PATENT DOCUMENTS

JP 11-155286 6/1999
JP 2005-5593 1/2005
(Continued)

*Primary Examiner* — Patrick Chen
(74) *Attorney, Agent, or Firm* — Oblon, McClelland, Maier & Neustadt, L.L.P.

(57) ABSTRACT

A semiconductor device according to an embodiment includes a plurality of circuit units each includes a first electrode, a second electrode, a switching element portion including first and second switching elements electrically connected between the first electrode and the second electrode, and a capacitor portion including a capacitor electrically connected between the first electrode and the second electrode and stacked with the switching element portion. In two of the adjacent circuit units, the switching element portion of one circuit unit and the capacitor portion of the other circuit unit are adjacent to each other, the capacitor portion of the one and the switching element portion of the other are adjacent to each other, the first electrode of the one and the first electrode of the other are adjacent to each other, and the second electrode of the one and the second electrode of the other are adjacent to each other.

19 Claims, 9 Drawing Sheets

(51) Int. Cl.
  *H02M 7/537* (2006.01)
  *H02M 7/00* (2006.01)
  *H05K 7/14* (2006.01)
  *H02M 1/32* (2007.01)

(58) Field of Classification Search
  CPC .................. H01L 28/82; H01L 28/84; H01L 28/86–28/88; H01L 28/90–28/92; H01L 28/40; H03K 17/04; H03K 17/567; H03K 17/687; H05K 7/1432; H02M 7/003; H02M 1/32; H02M 7/537
  USPC ........................................................ 327/374
  See application file for complete search history.

(56) References Cited

U.S. PATENT DOCUMENTS

| | | |
|---|---|---|
| 6,943,445 B2 | 9/2005 | Shirakawa et al. |
| 2010/0117212 A1* | 5/2010 | Corisis .................. H01L 21/561 257/686 |
| 2012/0307540 A1* | 12/2012 | Tagome ................ H02M 1/088 363/131 |
| 2013/0003309 A1 | 1/2013 | Stella |
| 2014/0084993 A1* | 3/2014 | Takao ....................... G05F 3/20 327/534 |
| 2014/0375153 A1 | 12/2014 | Suzuki |
| 2015/0155276 A1 | 6/2015 | Takao et al. |
| 2016/0284683 A1 | 9/2016 | Takao et al. |

FOREIGN PATENT DOCUMENTS

| | | |
|---|---|---|
| JP | 2007-12721 | 1/2007 |
| JP | 2007-234690 | 9/2007 |
| JP | 2014-67760 | 4/2014 |
| JP | 2015-6116 | 1/2015 |
| JP | 2015-19110 | 1/2015 |
| JP | 2015-106646 | 6/2015 |
| JP | 2016-181675 | 10/2016 |

* cited by examiner

SEMICONDUCTOR DEVICE, INVERTER CIRCUIT, DRIVING DEVICE, VEHICLE, AND ELEVATOR

CROSS-REFERENCE TO RELATED APPLICATION

This application is based upon and claims the benefit of priority from Japanese Patent Application No. 2015-061797, filed on Mar. 24, 2015, and Japanese Patent Application No. 2015-238930, filed on Dec. 7, 2015, the entire contents of which are incorporated herein by reference.

FIELD

Embodiments described herein relate generally to a semiconductor device, an inverter circuit, a driving device, a vehicle, and an elevator.

BACKGROUND

For example, in a power semiconductor module such as a power conversion module, there may be a problem that the faster switching operation is, the more likely breakdown of a device and noise generation may be caused by overvoltage during turn-off time. The overvoltage during the turn-off time is proportional to a time change rate between inductance inside circuit wiring and current flowing in the power semiconductor module (di/dt).

When a switching time is taken long in order to suppress overvoltage, switching operation becomes slow. Simultaneously, a switching loss represented by time integration of a product of current and voltage is increased. In order to suppress overvoltage and further reduce the switching loss, it is desirable to reduce inductance of the power semiconductor module. There is a method to divide the power semiconductor module into a plurality of circuit units in order to reduce inductance.

DETAILED DESCRIPTION

Figure 1A:
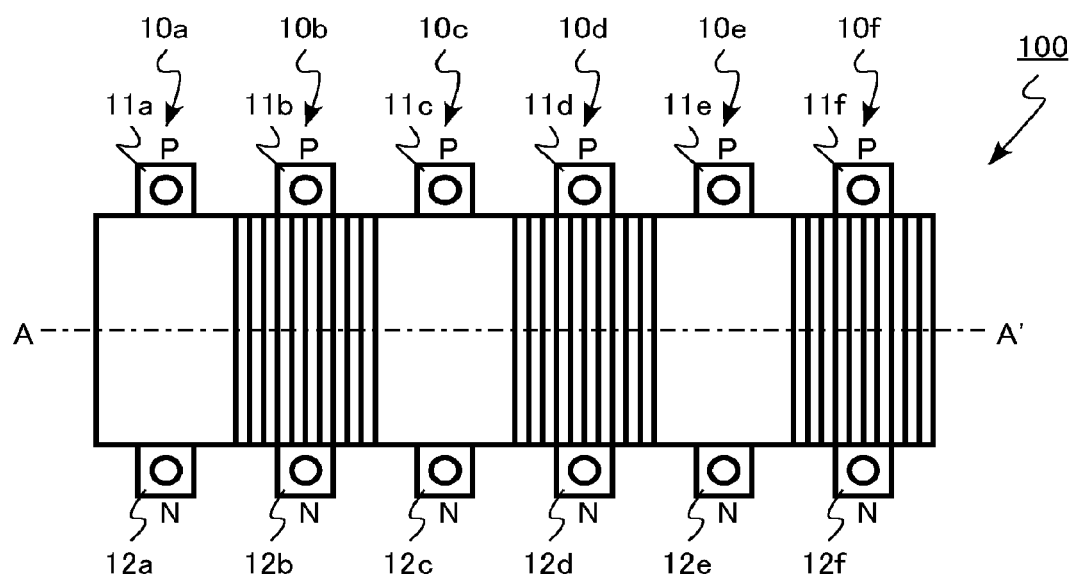
FIG. 1A is a schematic diagram illustrating a semiconductor device according to a first embodiment.

A semiconductor device according to an embodiment includes a plurality of circuit units, and each of the circuit units includes a first electrode, a second electrode, a switching element portion including a first switching element and a second switching element electrically connected in series between the first electrode and the second electrode, and a capacitor portion including a capacitor electrically connected in parallel to the first switching element and the second switching element between the first electrode and the second electrode, and stacked with the switching element portion. In two of the adjacent circuit units, the switching element portion of one circuit unit and the capacitor portion of the other circuit unit are adjacent to each other, the capacitor portion of the one and the switching element portion of the other are adjacent to each other, the first electrode of the one and the first electrode of the other are adjacent to each other, and the second electrode of the one and the second electrode of the other are adjacent to each other.

Embodiments of the present disclosure will be described below with reference to the drawings. In the following description, it is noted that the same component or the like will be denoted by the same reference sign and a description for a component or the like once described will be suitably omitted.

First Embodiment

A semiconductor device according to the present embodiment includes a plurality of circuit units, and each of the circuit units includes a first electrode, a second electrode, a switching element portion including a first switching element and a second switching element electrically connected in series between the first electrode and the second electrode, and a capacitor portion including a capacitor electrically connected in parallel to the first switching element and the second switching element between the first electrode and the second electrode, and stacked with the switching element portion. Further, in two of the adjacent circuit units, the switching element portion of one circuit unit and the capacitor portion of the other circuit unit are adjacent to each other, the capacitor portion of the one and the switching element portion of the other are adjacent to each other, the first electrode of the one and the first electrode of the other are adjacent to each other, and the second electrode of the one and the second electrode of the other are adjacent to each other.

Further, a semiconductor device according to the present embodiment includes a first circuit unit and a second of circuit unit, and each of the first circuit unit and the second circuit unit includes a first electrode, a second electrode, a switching element portion including a first switching element and a second switching element electrically connected in series between the first electrode and the second electrode, and a capacitor portion including a capacitor electrically connected in parallel to the first switching element and the second switching element between the first electrode and the second electrode, and stacked with the switching element portion. The switching element portion of the first circuit unit and the capacitor portion of the second circuit unit are adjacent to each other, the capacitor portion of the first circuit unit and the switching element portion of the second circuit unit are adjacent to each other, the first electrode of the first circuit unit and the first electrode of the second circuit unit are adjacent to each other, and the second electrode of the first circuit unit and the second electrode of the second circuit unit are adjacent to each other.

Figure 1B:
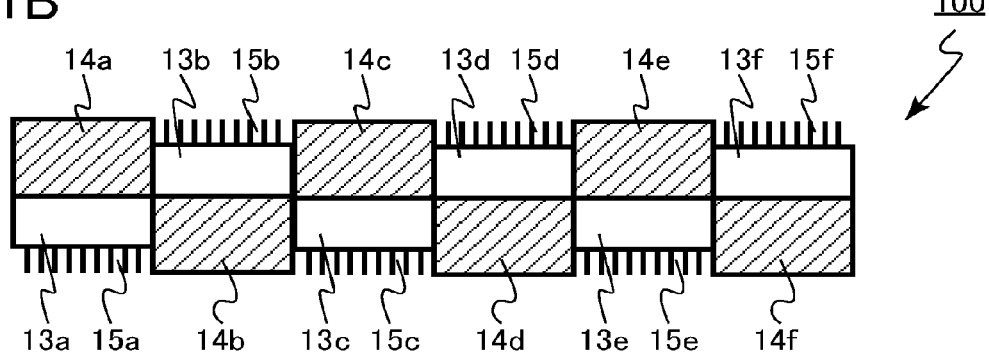
FIG. 1B is a schematic diagram illustrating a semiconductor device according to a first embodiment.

FIGS. 1A and 1B are schematic diagrams illustrating a semiconductor device according to the present embodiment. FIG. 1A is a plan view, and FIG. 1B is a cross-sectional view taken along a line A-A' in FIG. 1A. The semiconductor device according to the present embodiment is a semiconductor module used in an inverter circuit.

A semiconductor module 100 includes a plurality of circuit units 10a to 10f. Further, the circuit units 10a to 10f include first electrodes 11a to 11f, second electrodes 12a to 12f, switching element portions 13a to 13f, capacitor portions 14a to 14f, and heat sinks 15a to 15f respectively. Further, the circuit units 10a to 10f respectively include gate signal terminals not illustrated.

The circuit units 10a to 10f have a structure in which the switching element portions 13a to 13f and the capacitor portions 14a to 14f are vertically stacked respectively. The capacitor portions 14a to 14f in the respective circuit units 10a to 10f are disposed in upper portions or lower portions of the switching element portions 13a to 13f. The heat sinks 15a to 15f are respectively provided on opposite sides of the capacitor portions 14a to 14f interposing the switching element portions 13a to 13f.

The plurality of circuit units 10a to 10f is horizontally arranged adjacent to each other in an aligned manner.

In two of the adjacent circuit units, the switching element portion of one circuit unit and the capacitor portion of the other circuit unit are adjacent to each other, and the capacitor portion of the one and the switching element portion of the other are adjacent to each other. For example, attention is focused on the circuit unit 10a and the circuit unit 10b adjacent to each other. The switching element portion 13a of the circuit unit 10a and the capacitor portion 14b of the circuit unit 10b are adjacent to each other. Further, the capacitor portion 14a of the circuit unit 10a and the switching element portion 13b of the circuit unit 10b are adjacent to each other.

In other words, in two of the adjacent circuit units, a distance between the switching element portion of the one circuit unit and the capacitor portion of the other circuit unit is shorter than a distance between the switching element portion of the one and the switching element portion of the other. Further, in other words, two of the adjacent circuit units are arranged in a relation vertically reversed. The situation is similar in other two of the adjacent circuit units.

Further, in two of the adjacent circuit units, the first electrode and the first electrode are adjacent to each other and the second electrode and the second electrode are adjacent to each other. For example, attention is focused on the circuit unit 10a and the circuit unit 10b adjacent to each other. The first electrode 11a of the circuit unit 10a and the first electrode 11b of the circuit unit 10b are adjacent to each other. Further, the second electrode 12a of the circuit unit 10a and the second electrode 12b of the circuit unit 10b are adjacent to each other. The situation is similar in other two of the adjacent circuit units.

The first electrodes 11a to 11f are applied with common potential. The second electrodes 12a to 12f are applied with common potential. The circuit units 10a to 10f are connected in parallel.

The second electrodes 12a to 12f are applied with the potential lower than potential applied to the first electrodes 11a to 11f. The first electrodes 11a to 11f are applied with positive potential. The second electrodes 12a to 12f are grounded or applied with negative potential.

Figure 2:
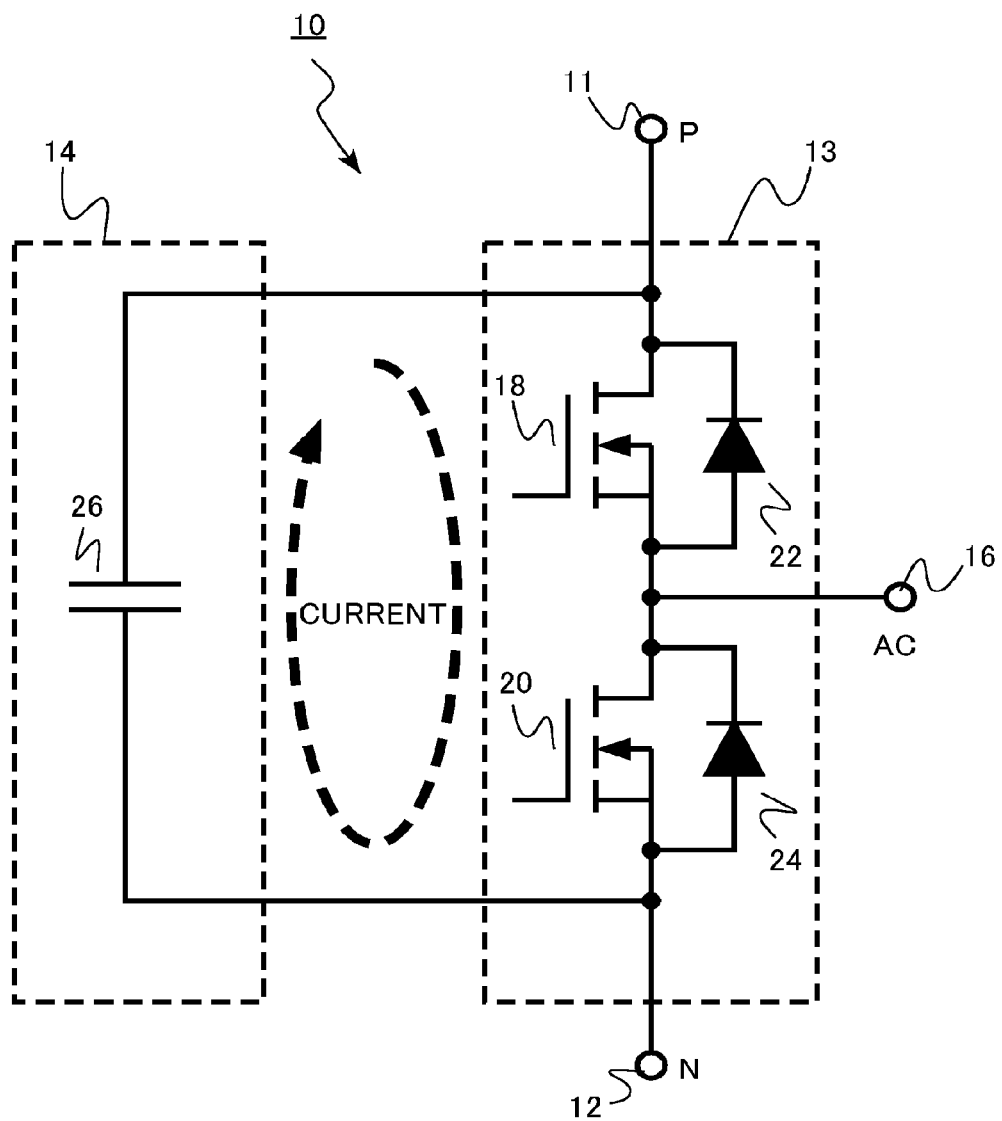
FIG. 2 is a diagram illustrating an equivalent circuit of a circuit unit according to the first embodiment.

FIG. 2 is a diagram illustrating an equivalent circuit of the circuit unit according to the present embodiment. The circuit diagram corresponds to the circuit of each of the circuit units 10a to 10f.

A circuit unit 10 includes a first electrode 11, a second electrode 12, a switching element portion 13, a capacitor portion 14, and an AC electrode (third electrode) 16.

The switching element portion 13 includes a first switching element 18, a second switching element 20, a first diode 22, and a second diode 24. The first switching element 18, second switching element 20, first diode 22, and second diode 24 are mounted on, for example, an insulating substrate or a conductive substrate not illustrated.

The first switching element 18 and the second switching element 20 are electrically connected in series between the first electrode 11 and the second electrode 12. The first switching element 18 and the second switching element 20 are, for example, metal oxide semiconductor field effect transistors (MOSFET) of silicon carbide (SiC).

The first diode 22 is connected in parallel to the first switching element 18. The second diode 24 is connected in parallel to the second switching element 20. The first diode 22 and the second diode 24 are flywheel diodes.

The capacitor portion 14 includes a capacitor 26. The capacitor 26 is electrically connected between the first electrode 11 and the second electrode 12 in parallel to the first switching element 18 and the second switching element 20.

The second electrode 12 is applied with the potential lower than potential applied to the first electrode 11. The first electrode 11 is applied with positive potential. The second electrode 12 is grounded or applied with negative potential.

The AC electrode 16 is connected between the first switching element 18 and the second switching element 20. AC voltage is output from the AC electrode 16 by controlling gate voltage at the first switching element 18 and the second switching element 20.

While the second switching element 20 is changed from an ON state to an OFF state, current flows via the first diode 22 in a direction indicated by a dotted arrow in FIG. 2. Further, while the first switching element 18 is changed from the ON state to the OFF state, current flows via the second diode 24 in the direction indicated by the dotted arrow in FIG. 2.

Next, function and effects of the semiconductor device according to the present embodiment will be described.

Figure 3A:
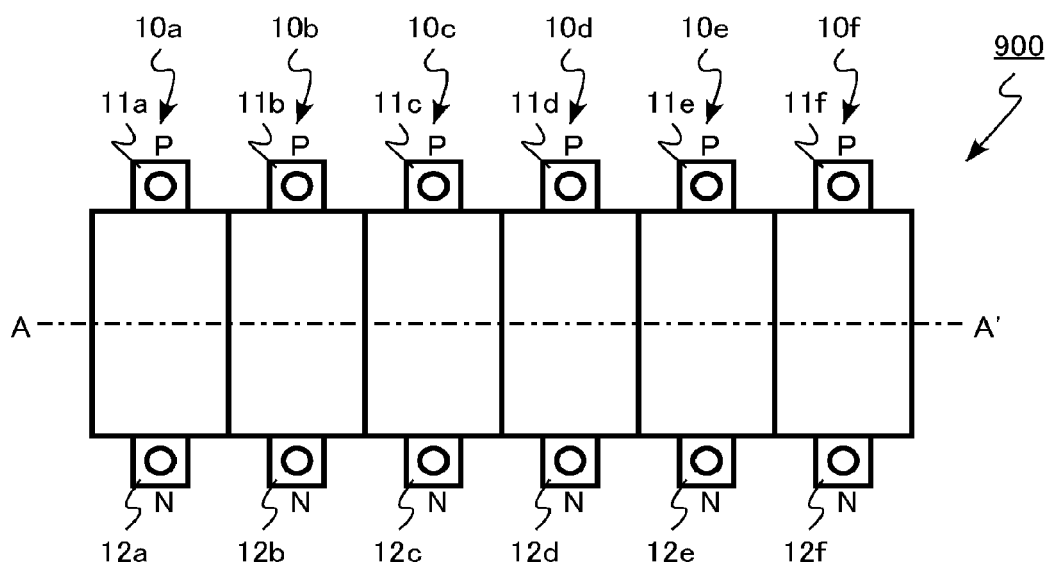
FIG. 3A is a schematic diagram illustrating a semiconductor device according to a comparative embodiment.
Figure 3B:
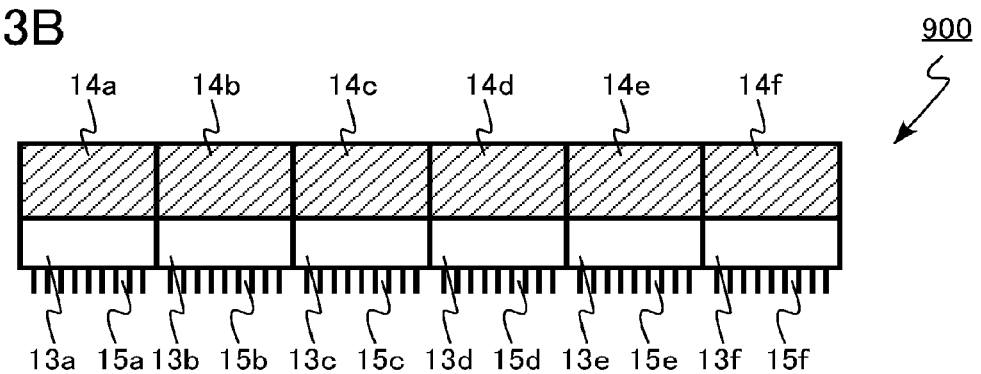
FIG. 3B is a schematic diagram illustrating a semiconductor device according to a comparative embodiment.

FIGS. 3A and 3B are schematic diagrams illustrating a semiconductor device according to a comparative embodiment. FIG. 3A is a plan view, and FIG. 3B is a cross-sectional view taken along a line A-A' in FIG. 3A. The semiconductor device in the comparative embodiment is a semiconductor module used in an inverter circuit.

A semiconductor module 900 differs from the semiconductor module 100 according to the present embodiment in that a switching element portion of one circuit unit and a switching element portion of the other circuit unit are adjacent to each other and a capacitor portion of the one and a capacitor portion of the other are adjacent to each other in two of the adjacent circuit units. In other words, the semiconductor module 900 differs from the semiconductor module 100 according to the present embodiment in that the two of the adjacent circuit units are arranged in a relation vertically the same.

The semiconductor module 900 is divided into a plurality of circuit units 10a to 10f, thereby reducing inductance. When mutual inductance between the circuit units 10a to 10f is disregarded, inductance of the semiconductor module 900 is reduced to 1/N by dividing the semiconductor module 900 into N circuit units. In the comparative embodiment, the number of circuit units is six. Therefore, inductance is reduced to ⅙.

Accordingly, overvoltage proportional to a time change rate between inductance and current flowing in a power semiconductor module (di/dt) is suppressed during turn-off time. As a result, breakdown of an element and noise generation can be suppressed.

Figure 4A:
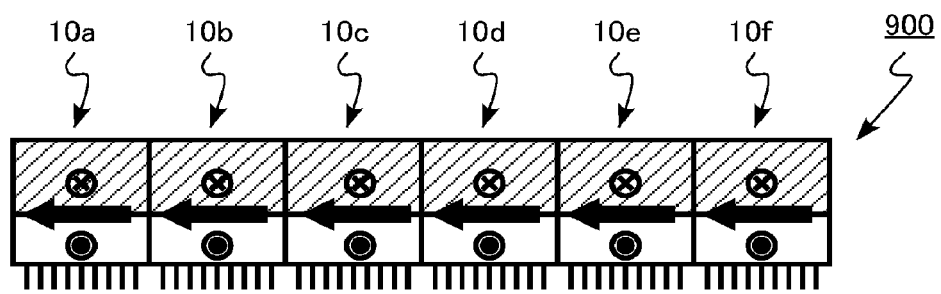
FIG. 4A is a diagram illustrating current directions and magnetic flux directions at the time of operating the semiconductor devices according to the comparative embodiment and the first embodiment.
Figure 4B:
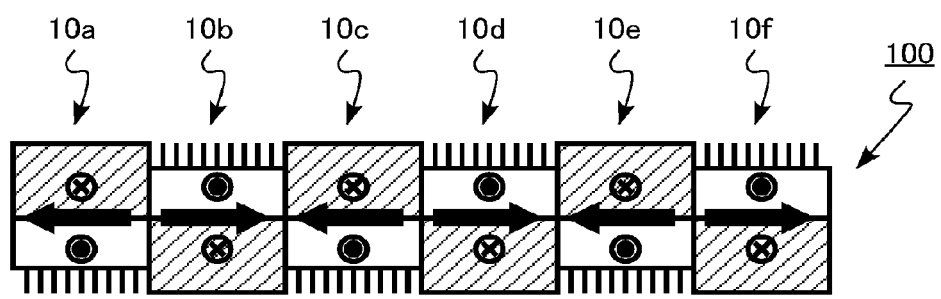
FIG. 4B is a diagram illustrating current directions and magnetic flux directions at the time of operating the semiconductor devices according to the comparative embodiment and the first embodiment.

FIGS. 4A and 4B are diagrams illustrating current directions and magnetic flux directions at the time of operating the semiconductor devices according to the comparative embodiment and the first embodiment. FIG. 4A is the case of comparative embodiment, and FIG. 4B is the case of the present embodiment. In the drawings, black arrows indicate magnetic flux directions.

As illustrated in FIG. 4A, in the semiconductor module 900 according to the comparative embodiment, the magnetic fluxes directions of the circuit units 10a to 10f are the same, and mutually strengthened. Therefore, mutual inductance is added to the inductance, and inductance of the semiconductor module 900 is increased.

Inductance is reduced by dividing the semiconductor module is divided into the plurality of circuit units 10a to 10f also in the semiconductor module 100. Further, as illustrated in FIG. 4B, the magnetic flux directions of the circuit units 10a to 10f are opposite and cancelled each other in the semiconductor module 100 according to the present embodiment. Therefore, the mutual inductance is subtracted from the inductance, and the inductance is further reduced. As a result, breakdown of an element and noise generation can be further suppressed.

Further, in the semiconductor module 100 according to the present embodiment, the first electrode and the first electrode are adjacent to each other and the second electrode and the second electrode are adjacent to each other in two of the adjacent circuit units. Therefore, connection between a plurality of first electrodes and connection between a plurality of second electrodes are facilitated.

According to the present embodiment, provided is the semiconductor module in which inductance is reduced and breakdown of an element and noise generation can be suppressed.

Note that the number of the circuit units is not limited to six although the example of having the six circuit units has been described here. The number of the circuit units can be optional as far as the number of the circuit units is two or more.

Second Embodiment

A semiconductor device according to the present embodiment is similar to the first embodiment except for that circuit units are arranged in an annular shape. Therefore, a description for the matters overlapping with the first embodiment will be partly omitted.

Figure 5:
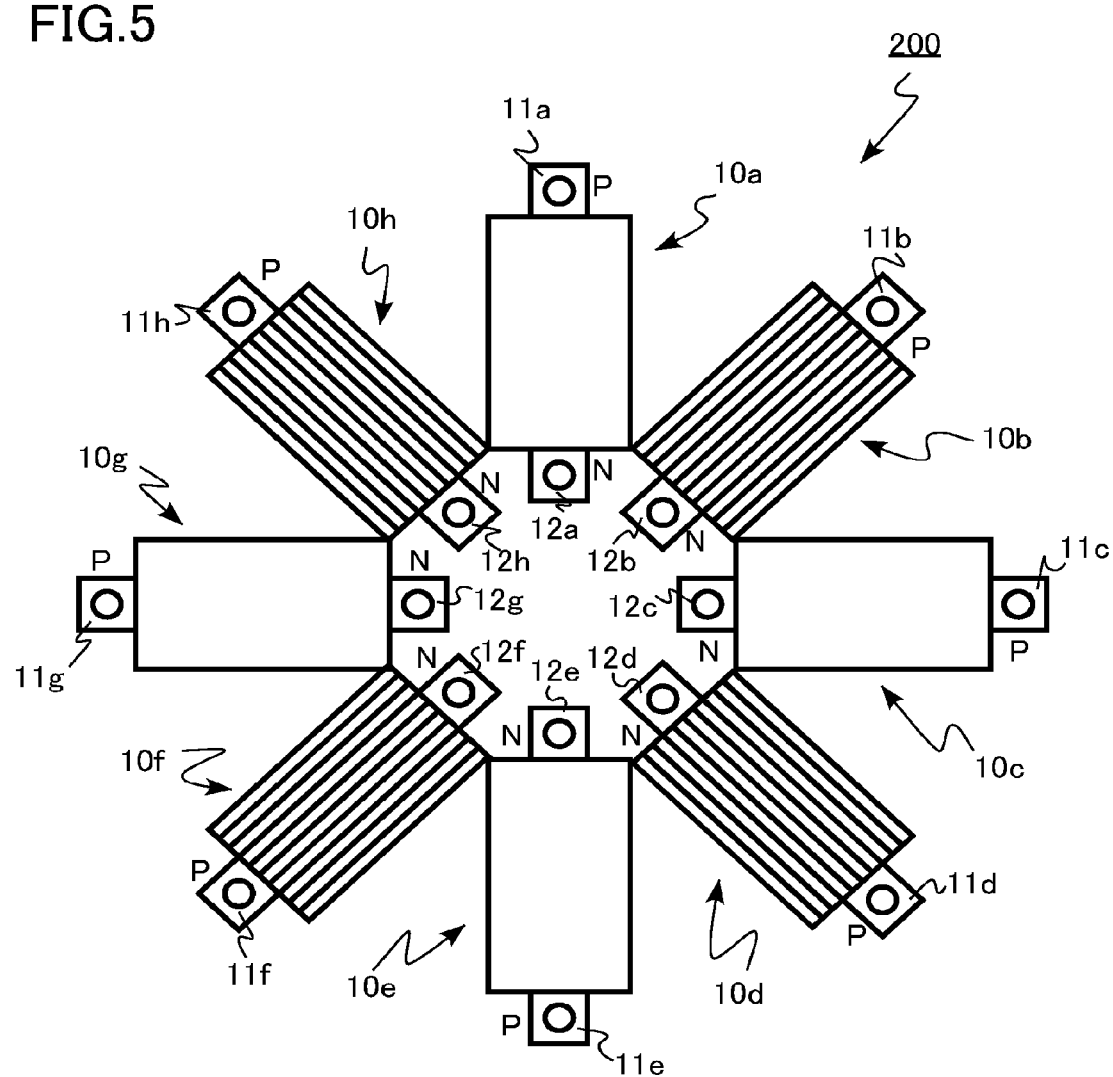
FIG. 5 is a schematic plan view illustrating a semiconductor device according to a second embodiment.

FIG. 5 is a schematic plan view illustrating the semiconductor device according to the present embodiment. The semiconductor device according to the present embodiment is a semiconductor module used in an inverter circuit.

In a semiconductor module 200, a plurality of circuit units 10a to 10h is arranged in an annular shape. The circuit units 10a to 10h are arranged in a manner such that directions to respectively connect the first electrodes 11a to 11h to the second electrodes 12a to 12h of the respective circuit units 10a to 10h become radial. In other words, the circuit units 10a to 10h are arranged in a circle shape.

For example, in the semiconductor module according to the first embodiment illustrated in FIG. 1, the circuit units 10b to 10e excluding the circuit units 10a and 10f positioned on both ends are each affected by magnetic fluxes of two circuit units located on both sides thereof in the same manner. However, the circuit unit 10a and the circuit unit 10f positioned on both ends are each affected only by a magnetic flux of one circuit unit adjacent thereto. Therefore, distribution of a magnetic field becomes non-uniform between the circuit units 10a to 10f, and current distribution becomes non-uniform between the circuit units 10a to 10f.

When current distribution between the circuit units 10a to 10f becomes non-uniform, it is necessary to take a large design margin for rated current of the semiconductor module. Therefore, manufacturing cost of the semiconductor module may be increased.

As illustrated in FIG. 5, in the semiconductor module 200 according to the present embodiment, all of the circuit units 10a to 10h are each affected by magnetic fluxes of two circuit units located on both sides thereof in the similar manner. Therefore, uniformity of magnetic field distribution between the circuit units 10a to 10h is improved, and uniformity of current distribution between the circuit units 10a to 10h is improved.

When uniformity of current distribution between the circuit units 10a to 10h is improved, the design margin for the rated current of the semiconductor module can be reduced. Therefore, the manufacturing cost of the semiconductor module can be reduced.

According to the present embodiment, provided is the semiconductor module in which inductance is reduced and breakdown of an element and noise generation can be suppressed. Further, uniformity of current distribution between the circuit units is improved and the manufacturing cost of the semiconductor module can be reduced.

Note that the number of the circuit units is not limited to eight although the example of having the eight circuit units has been described. As far as the number of the circuit units is four or more and an even number, the magnetic flux directions of the adjacent circuit units become opposite and the number of circuit units can be optional.

Third Embodiment

An inverter circuit and a driving device according to the present embodiment are driving devices each including a semiconductor device according to the second embodiment.

Figure 6:
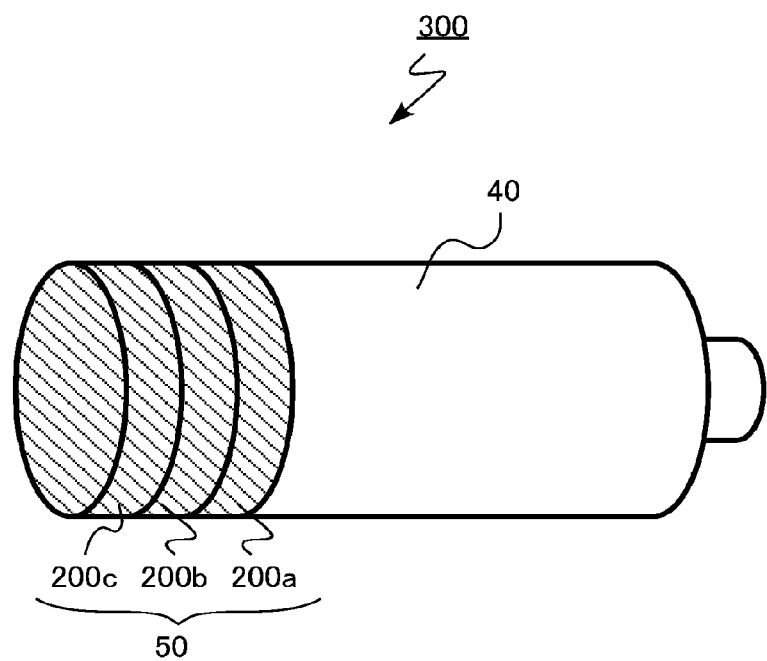
FIG. 6 is a schematic perspective views illustrating a driving device according to a third embodiment.

FIG. 6 is a schematic perspective view illustrating the driving device including the semiconductor device according to the present embodiment. A driving device 300 includes a motor 40 and an inverter circuit 50.

The inverter circuit 50 is provided on a back surface of the motor 40. The inverter circuit 50 is formed of three semiconductor modules 200a, 200b, 200c having the same structure as a semiconductor module 200 according to the second embodiment. The three semiconductor modules 200a, 200b, 200c are connected in parallel, thereby implementing the three-phase inverter circuit 50 including three AC voltage output terminals U, V, W. The motor 40 is driven by AC voltage output from the inverter circuit 50.

Breakdown of an element and noise generation can be further suppressed also in the inverter circuit 50 and the driving device 300 according to the present embodiment. Further, manufacturing cost can be reduced. Furthermore, each of the semiconductor modules 200a, 200b, 200c is arranged in a disk-like shape by arranging the circuit units in a circle shape. Therefore, the semiconductor modules can be provided on the back surface of the motor 40 and the driving device 300 can be downsized.

Fourth Embodiment

A vehicle according to the present embodiment is a vehicle including a semiconductor device according to a first embodiment.

Figure 7:
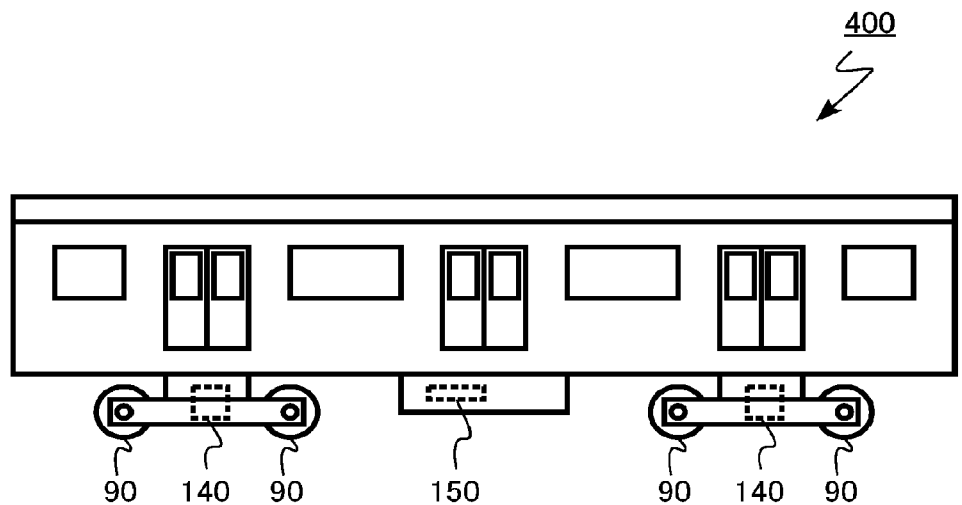
FIG. 7 is a schematic diagram illustrating a vehicle according to a fourth embodiment.

FIG. 7 is a schematic diagram illustrating a vehicle according the present embodiment. A vehicle 400 according to the present embodiment is a railway vehicle. The vehicle 400 includes a motor 140 and an inverter circuit 150.

The inverter circuit 150 is formed of three semiconductor modules each having a structure same as a semiconductor module 100 according to the first embodiment. The three semiconductor modules are connected in parallel, thereby implementing the three-phase inverter circuit 150 including three AC voltage output terminals U, V, W.

The motor 140 is driven by AC voltage output from the inverter circuit 150. A wheel 90 of the vehicle 400 is rotated by the motor 140.

The vehicle 400 according to the present embodiment includes the inverter circuit 150 in which breakdown of an element and noise generation is suppressed, thereby providing high reliability.

Fifth Embodiment

A vehicle according to the present embodiment is a vehicle including a semiconductor device according to a first embodiment.

Figure 8:
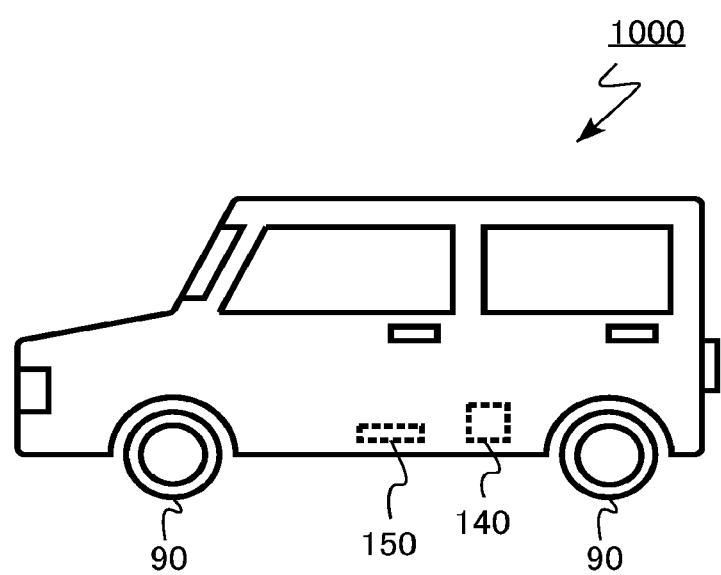
FIG. 8 is a schematic diagram illustrating a vehicle according to a fifth embodiment.

FIG. 8 is a schematic diagram illustrating a vehicle according to the present embodiment. A vehicle 1000 according to the present embodiment is an automobile. The vehicle 1000 includes a motor 140 and an inverter circuit 150.

The inverter circuit 150 is formed of three semiconductor modules each having a structure same as a semiconductor module 100 according to the first embodiment. The three semiconductor modules are connected in parallel, thereby implementing the three-phase inverter circuit 150 including three AC voltage output terminals U, V, W.

The motor 140 is driven by AC voltage output from the inverter circuit 150. A wheel 90 of the vehicle 1000 is rotated by the motor 140.

The vehicle 1000 according to the present embodiment includes the inverter circuit 150 in which breakdown of an element and noise generation is suppressed, thereby providing high reliability.

Sixth Embodiment

An elevator according to the present embodiment is an elevator including a semiconductor device according to a first embodiment.

Figure 9:
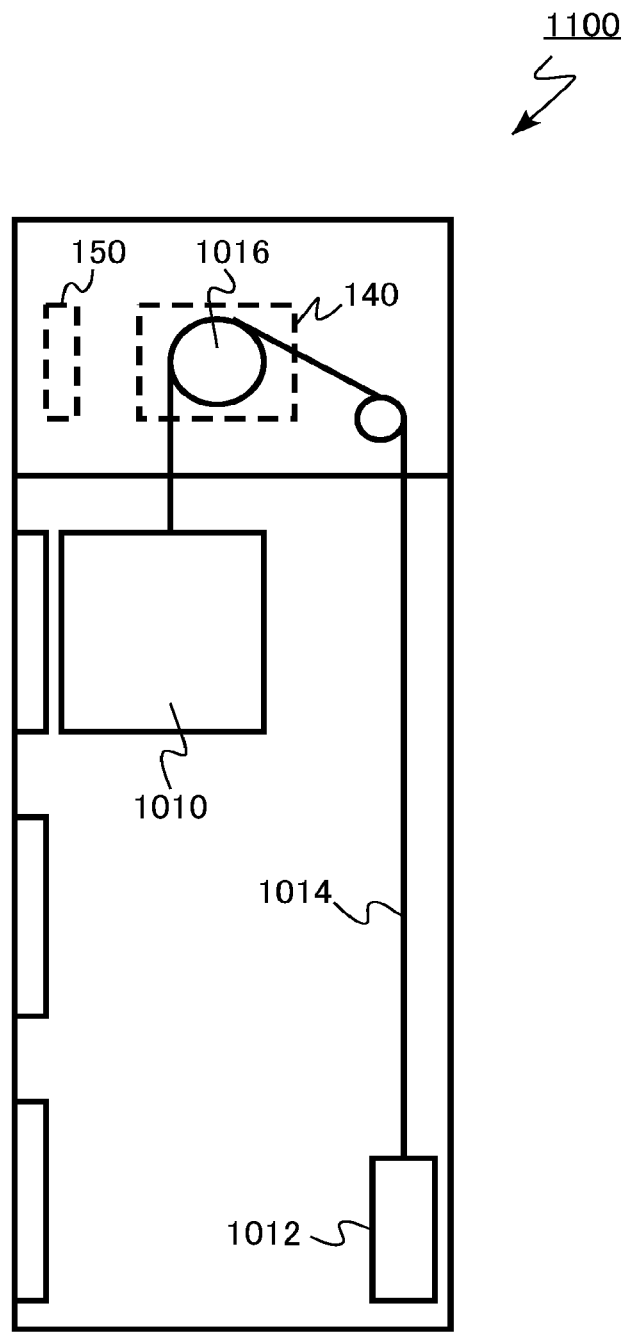
FIG. 9 is a schematic diagram illustrating an elevator according to a sixth embodiment.

FIG. 9 is a schematic diagram of the elevator according to the present embodiment. An elevator 1100 according to the present embodiment includes a basket 1010, a counterweight 1012, a wire rope 1014, a winding machine 1016, a motor 140, and an inverter circuit 150.

The inverter circuit 150 is formed of three semiconductor modules each having a structure same as a semiconductor module 100 according to the first embodiment. The three semiconductor modules are connected in parallel, thereby implementing the three-phase inverter circuit 150 including three AC voltage output terminals U, V, W.

The motor 140 is driven by AC voltage output from the inverter circuit 150. The winding machine 1016 is rotated by the motor 140, and the basket 1010 is moved up and down.

The elevator 1100 according to the present embodiment includes the inverter circuit 150 in which breakdown of an element and noise generation is suppressed, thereby providing high reliability.

Working Example

In the following, a working example will be described.

Figure 10A:
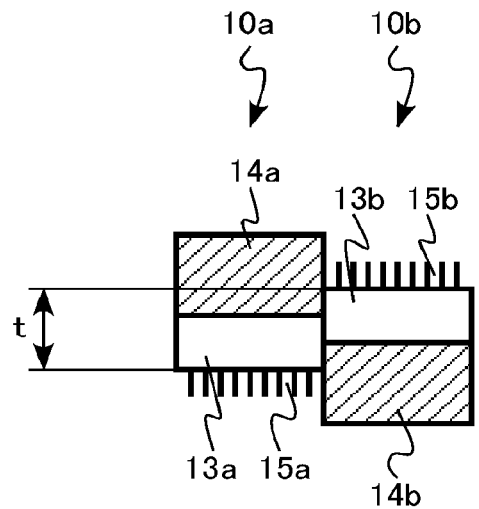
FIG. 10A is an explanatory diagram for a working example.
Figure 10B:
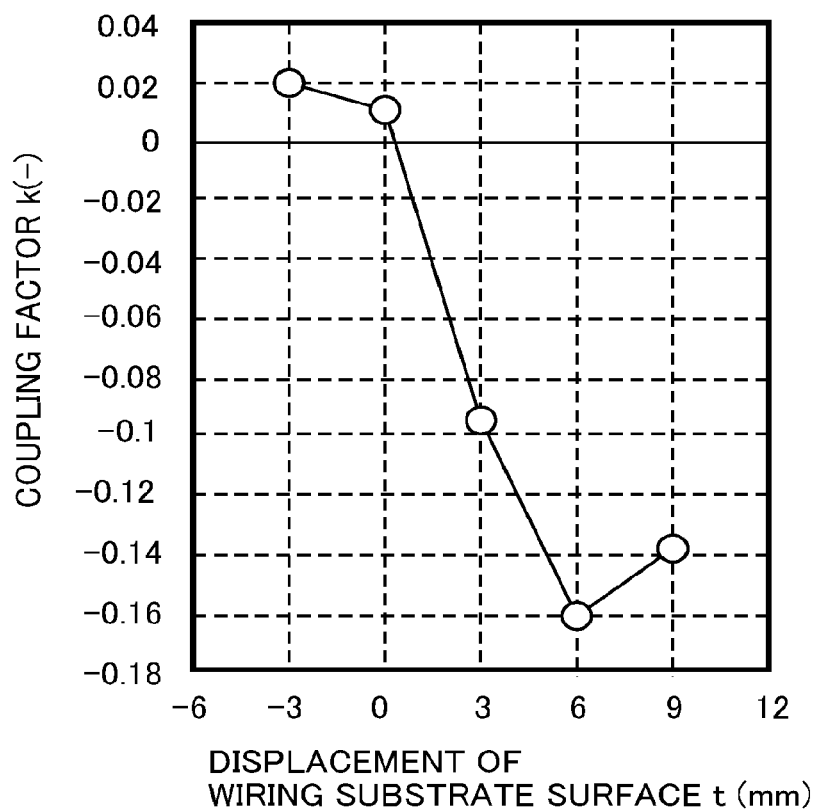
FIG. 10B is an explanatory diagram for a working example.

FIGS. 10A and 10B are explanatory diagrams for the working example. FIG. 10A is the explanatory diagram for a structure in which simulation is performed. FIG. 10B is the diagram illustrating a simulation result.

As illustrated in FIG. 10A, displacement of a wiring substrate surface (t) in each circuit unit is changed by relatively moving up and down two circuit units 10a and 10b arranged in a reversed manner. A coupling factor (k) between the respective circuit units is obtained through the simulation by varying the displacement (t).

A relation between the displacement of the wiring substrate surface (t) and the coupling factor (k) are shown. It is found that the coupling factor becomes negative when the wiring substrate surface (t) is displaced in a positive direction (direction in which the circuit unit 10b is relatively moved upward in FIG. 10A) from a position (t=0) which the wiring substrate surface coincides with. In other words, in the two adjacent circuit units 10a and 10b, the coupling factor becomes negative when the switching element portion 13a of one circuit unit and the capacitor portion 14b of the other circuit unit are arranged so as to be adjacent to each other and the capacitor portion 14a of the one and the switching element portion 13b of the other are arranged so as to be adjacent to each other. Since the coupling factor becomes negative, mutual inductance is subtracted from inductance, and the inductance is reduced.

The working example clearly shows the effects of the embodiments.

As described above, in the first to third embodiments, the example in which the first switching element and the second switching element are the MOSFETs has been described, but an insulated gate bipolar transistor (IGBT), a high electron mobility transistor (HEMI), and the like are also applicable.

Further, in the first to third embodiments, the example of applying silicon carbide (SiC) as semiconductor material of the first switching element and the second switching element has been described, but silicon (Si), gallium nitride (GaN), and the like are also applicable.

Further, according to the fourth to sixth embodiments, the exemplary cases of applying the semiconductor device according to the present disclosure to the vehicle and the elevator have been described, but the semiconductor device according to the present disclosure are also applicable to, for example, a power conditioner of a solar power system and the like.

While certain embodiments have been described, these embodiments have been presented by way of example only, and are not intended to limit the scope of the inventions.

Indeed, the semiconductor device, the inverter circuit, the driving device, the vehicle, and the elevator described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising a plurality of circuit units, each of the circuit units including:
 a first electrode;
 a second electrode;
 a switching element portion including a first switching element and a second switching element electrically connected in series between the first electrode and the second electrode; and
 a capacitor portion including a capacitor electrically connected between the first electrode and the second electrode, the capacitor electrically connected in parallel to the first switching element and the second switching element, and the capacitor portion stacked with the switching element portion, wherein
 on a first imaginary straight line, in a cross-sectional view of the semiconductor device, connecting the switching element portion of one of the circuit units and the capacitor portions of two other circuit units, the switching element portion of the one of the circuit units is disposed between the capacitor portions of the two other circuit units,
 on a second imaginary straight line, in the cross-sectional view of the semiconductor device, connecting the capacitor portion of the one of the circuit units and the switching element portions of the two other circuit units, the capacitor portion of the one of the circuits unit is disposed between the switching element portions of the two other circuit units,
 the first electrode of the one of the circuit units is disposed between the first electrodes of the other two circuit units, and
 the second electrode of the one of the circuit units is disposed between the second electrodes of the other two circuit units.

2. The semiconductor device according to claim 1, wherein the first electrodes of each of the circuit units are mutually connected and the second electrodes of each of the circuit units are mutually connected.

3. The semiconductor device according to claim 1, wherein, in two adjacent circuit units of the circuit units, a distance between the switching element portion of one circuit unit of the two adjacent circuit units and the capacitor portion of the other circuit unit of the two adjacent circuit units is shorter than a distance between the switching element portion of the one circuit unit and the switching element portion of the other circuit unit.

4. The semiconductor device according to claim 1, wherein each of the circuit units includes a third electrode connected between the first switching element and the second switching element.

5. The semiconductor device according to claim 1, wherein each of the circuit units includes a heat sink provided on an opposite side of the capacitor portion.

6. The semiconductor device according to claim 1, wherein the circuit units are arranged in an annular shape.

7. The semiconductor device according to claim 1, the first switching element and the second switching element are MOSFETs or IGBTs.

8. The semiconductor device according to claim 1, wherein one of two adjacent circuit units has a first magnetic flux direction and the other of the two adjacent circuit units has a second magnetic flux direction which is opposite to the first magnetic flux direction.

9. An inverter circuit including the semiconductor device according to claim 1.

10. A driving device including the semiconductor device according to claim 1.

11. A vehicle including the semiconductor device according to claim 1.

12. An elevator including the semiconductor device according to claim 1.

13. A semiconductor device comprising a first circuit unit and a second circuit unit arranged along a first direction, each of the first circuit unit and the second circuit unit including:
 a first electrode;
 a second electrode;
 a switching element portion including a first switching element and a second switching element electrically connected in series between the first electrode and the second electrode; and
 a capacitor portion including a capacitor electrically connected between the first electrode and the second electrode, the capacitor electrically connected in parallel to the first switching element and the second switching element, and the capacitor portion stacked with the switching element portion, wherein
 on a first imaginary straight line, parallel to the first direction and in a cross-sectional view of the semiconductor device, connecting the switching element portion of the first circuit unit and the capacitor portion of the second circuit unit, the switching element portion of the first circuit unit and the capacitor portion of the second circuit unit are adjacent to each other,
 on a second imaginary straight line, parallel to the first direction and in the cross-sectional view of the semiconductor device, connecting the capacitor portion of the first circuit unit and the switching element portion of the second circuit unit the capacitor portion of the first circuit unit and the switching element portion of the second circuit unit are adjacent to each other,
 the first electrode of the first circuit unit and the first electrode of the second circuit unit are adjacent to each other, and
 the second electrode of the first circuit unit and the second electrode of the second circuit unit are adjacent to each other.

14. The semiconductor device according to claim 13, wherein the first electrode of the first circuit and the first electrode of the second circuit are mutually connected and the second electrode of the first circuit and the second electrode of the second circuit are mutually connected.

15. The semiconductor device according to claim 13, wherein a distance between the switching element portion of the first circuit unit and the capacitor portion of the second circuit unit is shorter than a distance between the switching element portion of the first circuit unit and the switching element portion of the second circuit unit.

16. The semiconductor device according to claim 13, wherein each of the first circuit unit and the second circuit unit includes a third electrode connected between the first switching element and the second switching element.

17. The semiconductor device according to claim 13, wherein each of the first circuit unit and the second circuit unit includes a heat sink provided on an opposite side of the capacitor portion.

18. The semiconductor device according to claim 13, the first switching element and the second switching element are MOSFETs or TGBTs.

19. The semiconductor device according to claim 13, wherein a magnetic flux direction of the first circuit unit is opposite to a magnetic flux direction of the second circuit unit.

* * * * *